United States Patent [19]

Kumagai

[11] Patent Number: 5,561,388
[45] Date of Patent: Oct. 1, 1996

[54] SEMICONDUCTOR DEVICE HAVING CMOS CIRCUIT AND BIPOLAR CIRCUIT MIXED

[75] Inventor: Kouichi Kumagai, Tokyo, Japan

[73] Assignee: NEC Corporation, Japan

[21] Appl. No.: 331,968

[22] Filed: Oct. 31, 1994

[30] Foreign Application Priority Data

Nov. 2, 1993 [JP] Japan .................. 5-297228

[51] Int. Cl.⁶ ............ H03K 19/0175; H03K 19/08
[52] U.S. Cl. .................. 326/66; 326/18; 326/64
[58] Field of Search ................ 326/62–66, 68, 326/70–71, 73, 75, 76–77, 9, 17, 21

[56] References Cited

U.S. PATENT DOCUMENTS

| | | | |
|---|---|---|---|
| 4,453,095 | 6/1984 | Wrathall | 326/66 |
| 5,068,551 | 11/1991 | Bosnyak | 326/66 |
| 5,101,125 | 3/1992 | Hara et al. | 326/66 |
| 5,132,573 | 7/1992 | Tsuru et al. | 326/67 |

FOREIGN PATENT DOCUMENTS 0375979 7/1990 European Pat. Off. .
62-214655 9/1987 Japan .

OTHER PUBLICATIONS

IBM Technical Disclosure Bulletin, Level-Shifted Emitter--Follower BIMOS Circuits, vol. 34, No. 4A, Sep., 1991, pp. 142–144.

LaBuda et al., How BICMOS Fits Into an ECL Design Wescon/88 Conference Record, Nov. 1, 1988, pp. 11/1–11/7.

A. Denda et al., A 270 ps/24.000 Gate BiCMOS Gate Array, Proceedings of the IEEE 1989 Custom Integrated Circuits Conference, May 15–18, 1989, pp. 8.4.1–4.

*Primary Examiner*—Edward P. Westin
*Assistant Examiner*—Jon Santamauro
*Attorney, Agent, or Firm*—Whitham, Curtis, Whitham & McGinn

[57] ABSTRACT

In a semiconductor device where a CMOS circuit and a bipolar circuit are mixed, the bipolar circuit is operated between a first power supply voltage and a second power supply voltage, and the CMOS circuit and a level conversion circuit between a CMOS level and a bipolar level are operated between the first power supply voltage and a third power supply voltage. The third power supply voltage is between the first and second power supply voltages.

13 Claims, 9 Drawing Sheets

SEMICONDUCTOR DEVICE HAVING CMOS CIRCUIT AND BIPOLAR CIRCUIT MIXED

BACKGROUND OF THE INVENTION

1. Field of the Invention

The present invention relates to a semiconductor device, and more particularly, to a semiconductor device where MOS logic circuits and bipolar logic circuits are mixed.

2. Description of the Related Art

Recently, in a high speed logic large scale integrated (LSI) circuit, particularly, in a communication LSI circuit, bipolar circuits such as emitter coupled logic (ECL) circuits having high speed characteristics and high load characteristics and complementary metal oxide semiconductor (CMOS) circuits (or bipolar CMOS (BiCMOS)) having a low power consumption and a high manufacturing yield are constructed on the same chip to thereby improve the performance of a system.

In a first prior art semiconductor device where a CMOS circuit and an ECL circuit are mixed, the CMOS circuit is operated between a positive power supply voltage $V_{DD}$ and a ground voltage GND, and the ECL circuit is operated between the ground voltage GND and a negative power supply voltage $V_{EE}$. This will be explained later in detail.

In the first prior art semiconductor device, however, since the difference between CMOS logic signals and ECL logic signals is large, the number of elements of level conversion circuits is increased, and also, a time required for such a level conversion is increased.

In a second prior art semiconductor device where a CMOS circuit and an ECL circuit are mixed, the CMOS circuit is also operated between the ground voltage GND and the negative power supply voltage $V_{EE}$ in the same way as the ECL circuit (see JP-A-SHO62-214655). This will be also explained later in detail.

In the second prior art semiconductor device, however, since the CMOS circuit is operated based upon the power supply voltage $V_{EE}$ (precisely, −5.2 V or −4.5 V), the elements of the CMOS circuit are deteriorated in reliability, and the duration of gate insulating layers thereof is also deteriorated.

SUMMARY OF THE INVENTION

Therefore, in a semiconductor device where bipolar circuits and CMOS circuits (or BiCMOS circuits) are mixed, it is an object of the present invention to simplify level conversion circuits between CMOS logic signals and bipolar logic signals and also, to increase the level conversion speed, or establish a reliability of the CMOS circuits.

According to the present invention, in a semiconductor device where a CMOS (or BiCMOS) circuit and a bipolar circuit are mixed, the bipolar circuit is operated between a first power supply voltage and a second power supply voltage, and the CMOS circuit and a level conversion circuit between a CMOS level and a bipolar level are operated between the first power supply voltage and a third power supply voltage. The third power supply voltage is between the first and second power supply voltages.

That is, if the first, second and third power supply voltages are represented by GND, $V_{EE}$ and $V_{DD}'$, following is satisfied:

$$GND > V_{DD}' > V_{EE}.$$

For example, if GND=0V, $V_{EE}$=−4.5 V or −5.2 V, the CMOS (or BiCMOS) circuit and the level conversion circuit are operated on a negative power supply side; however, in this case, the power supply voltage amplitude (GND−$V_{DD}'$) thereof is smaller than a power supply voltage amplitude (GND−$V_{EE}$) on the negative power supply side of the bipolar circuit.

As a result, the logic signal level of the CMOS circuit (or BiCMOS circuit) approaches the logic signal level of the bipolar circuit, so that conversion between these logic signal levels is easy. In other words, conversion between the positive power supply side and the negative power supply side is carried out not in an internal block, but in an input block and an output block. Also, the CMOS (or BiCMOS) circuit operated on the positive power supply side can be operated on the negative power supply side without modifying the circuit and device configuration thereof.

BRIEF DESCRIPTION OF THE DRAWINGS

The present invention will be clearly understood from the description as set forth below, as compared with the prior art, with reference to the accompanying drawings, wherein.

DESCRIPTION OF THE PREFERRED EMBODIMENTS

Before the description of the preferred embodiments, prior art semiconductor devices will be explained with reference to FIGS. 1, 2A, 2B, 3, 4A and 4B.

Figure 1:
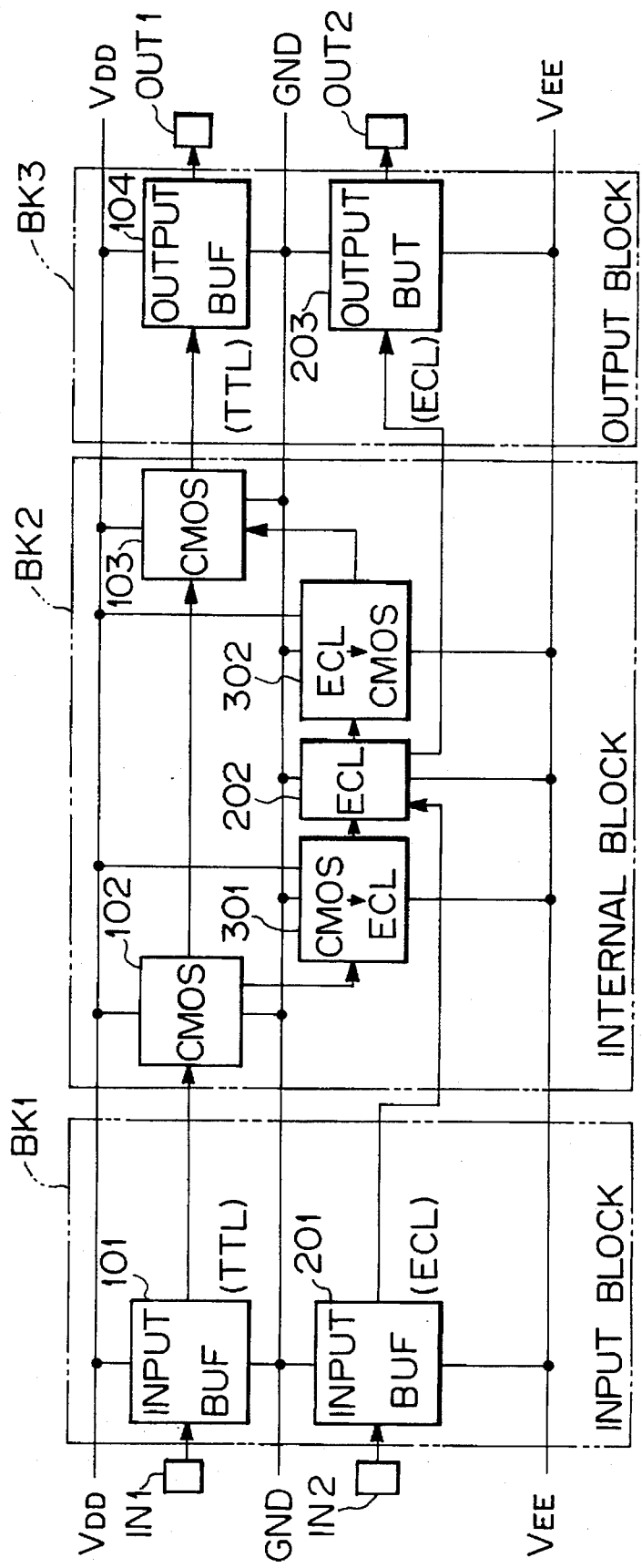
FIG. 1 is a block circuit diagram illustrating a first prior art semiconductor device.

In FIG. 1, which illustrates a first prior art semiconductor device, an input block BK1, an internal block BK2 and an output block BK3 are provided on the same chip.

In FIG. 1, a TTL input buffer 101 of the input block BK1, CMOS circuits 102 and 103 of the internal block BK2 and a TTL output buffer 104 of the output block BK3 are operated on a positive power supply side, i.e., between a power supply voltage $V_{DD}$ (such as +5 V or +3.3 V) and a ground voltage GND (0 V). Also, an ECL input buffer of the input block BK1, an ECL circuit 202 of the internal block BK2 and an ECL output buffer 203 of the output block BK3 are operated on a negative power supply side, i.e., between the ground voltage GND and a power power supply voltage $V_{EE}$ (such as −4.5 V or −5.2 V). Further, a CMOS to ECL level conversion circuit 301 for supplying an output of the CMOS circuit 102 to the ECL circuit 202 and an ECL to CMOS level conversion circuit for supplying an output of the ECL circuit 202 to an input of the CMOS circuit 103 are provided in the internal circuit BK2.

Figure 2A:
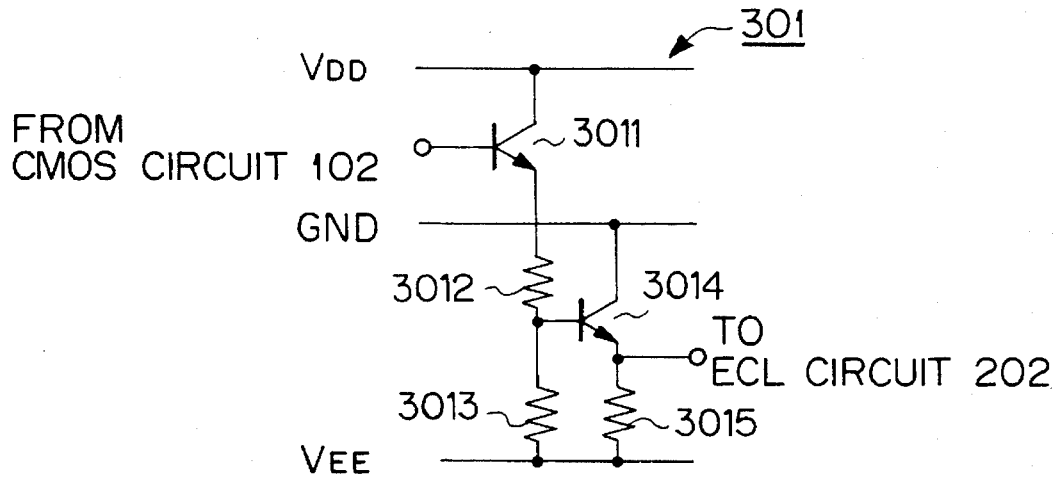
FIG. 2A is a detailed circuit diagram of the CMOS to ECL level conversion circuit of FIG. 1.
Figure 2B:
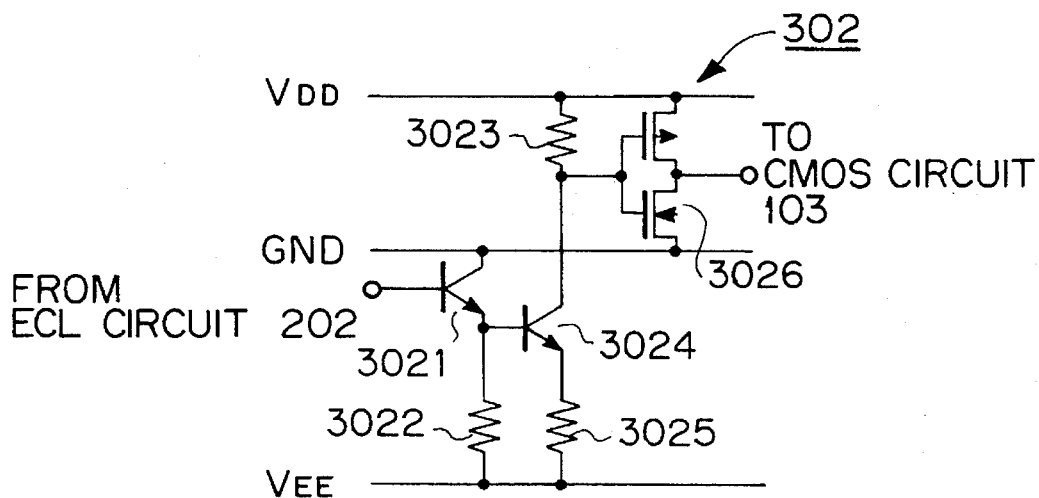
FIG. 2B is a detailed circuit diagram of the ECL to CMOS level conversion circuit of FIG. 1.

Also, the CMOS to ECL level conversion circuit is operated by the three power supply voltages $V_{DD}$, GND and $V_{EE}$. As illustrated in FIG. 2A, the CMOS to ECL level conversion level circuit 301 is constructed by a first level conversion stage including a transistor 3011 and resistors 3012 and 3013 in series between the power supplies $V_{DD}$ and $V_{EE}$ and a second level conversion stage including a transistor 3014 and a resistor 3015 in series between the power supplies GND and $V_{EE}$. Also, the ECL to CMOS level conversion circuit 302 is operated by the three power supply voltages $V_{DD}$, GND and $V_{EE}$. As illustrated in FIG. 2B, the ECL to CMOS level conversion circuit 302 is constructed by a first level conversion stage including a transistor 3021 and a resistor 3022 in series between the power supplies GND and $V_{EE}$, a second level conversion stage including a resistor 3023, a transistor 3024 and a resistor 3025 in series between the power supplies $V_{DD}$ and $V_{EE}$, and a third level conversion stage including a CMOS inverter 3026 between the power supplies $V_{DD}$ and GND.

Here, if $V_{DD}$=3.3 V, $V_{EE}$=−5.2 V, the CMOS logic amplitude is from 0 V to 3.3 V, and the ECL logic amplitude is −1.1 V ±0.3 V, then the difference in potential of a high level converted by the level conversion circuits 301 and 302 is 3.3 V+0.8 V=4.1 V, and also, the difference in potential of a low level converted by the level conversion circuits 301 and 302 is

0 V+1.4 V=1.4 V.

In FIG. 1, note that the elements of a system operated on the positive power supply side, i.e., by the two power supply voltages $V_{DD}$ and GND are indicated by reference numerals over 100 such as 101 to 104; the elements of a system operated on the negative power supply side, i.e., by the two power supply voltages $V_{EE}$ and GND are indicated by reference numerals over 200 such as 201 to 203; and the elements of a system operated by the three power supply voltages $V_{DD}$, $V_{EE}$ and GND are indicated by reference numerals over 300 such as 301 and 302.

In the semiconductor device of FIG. 1, however, as stated above, since the difference between CMOS logic signals and bipolar logic signals is large, the number of elements of level conversion circuits 301 and 302 is increased, and also, a time for such a level conversion is increased.

Figure 3:
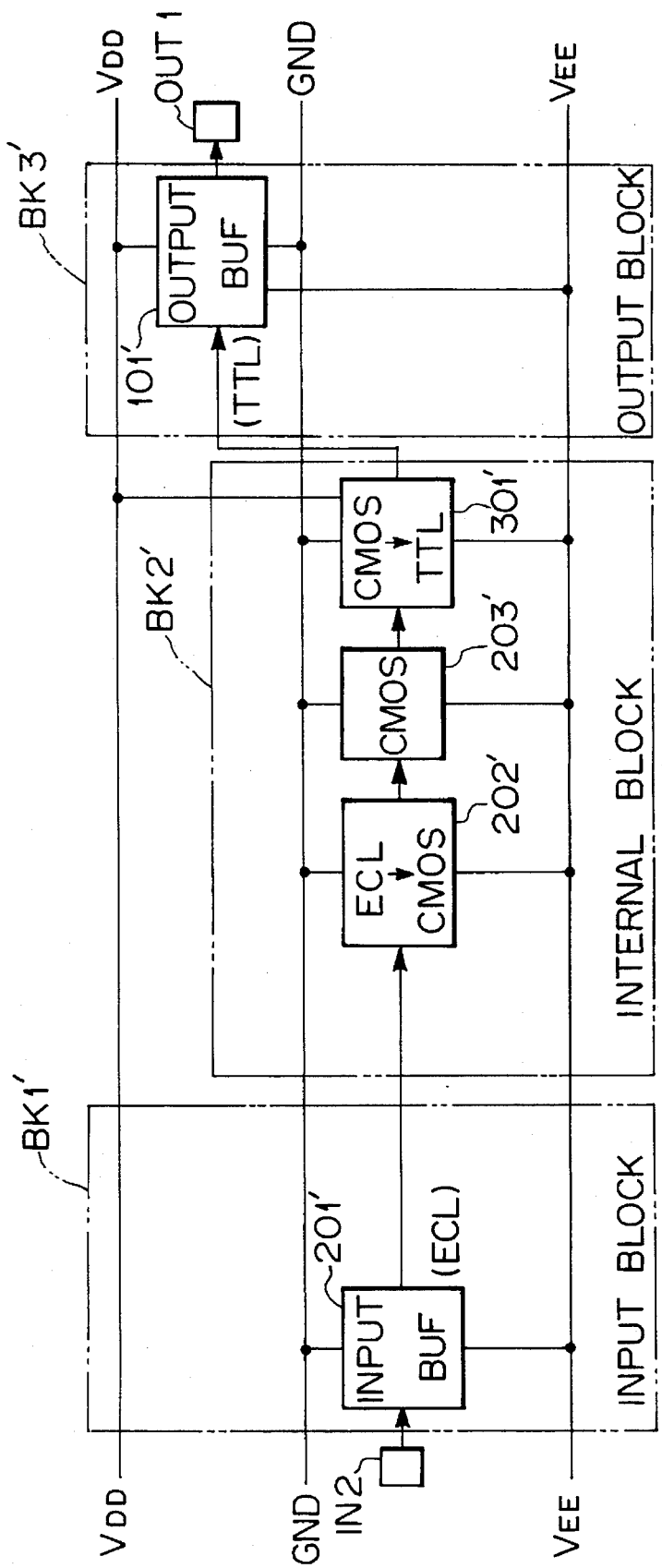
FIG. 3 is a block circuit diagram illustrating a second prior art semiconductor device.

In FIG. 3, which illustrates a second prior art semiconductor device, an input block BK1'; an internal block BK2' and an output block BK3' are provided on the same chip (see JP-A-SHO62-214655).

In FIG. 3, a TTL output buffer 101' of the output block BK3' is operated on a positive power side, i.e., between the power supply voltage $V_{DD}$ and the ground voltage GND. Also, an ECL input buffer 201' of the input block BK1', and an ECL to CMOS level conversion circuit 202' and a CMOS circuit 203' of the internal block BK2' are operated on a negative power side, i.e., between the ground voltage GND and the power supply voltage $V_{EE}$. Further, a CMOS to TTL level conversion circuit 301' is operated by the three power supply voltages $V_{DD}$, GND and $V_{EE}$.

Figure 4A:
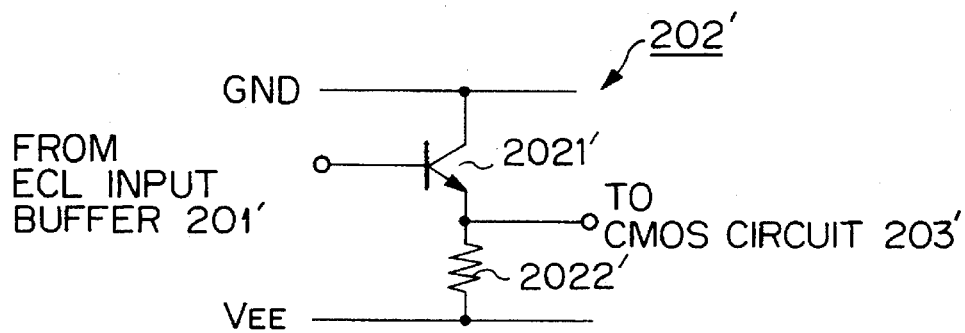
FIG. 4A is a detailed circuit diagram of the ECL to CMOS level conversion circuit of FIG. 3.

As illustrated in FIG. 4A, the ECL to CMOS level conversion circuit 202' is constructed by a transistor 2021' and a resistor 2022' in series between the power supplies GND and $V_{EE}$.

Figure 4B:
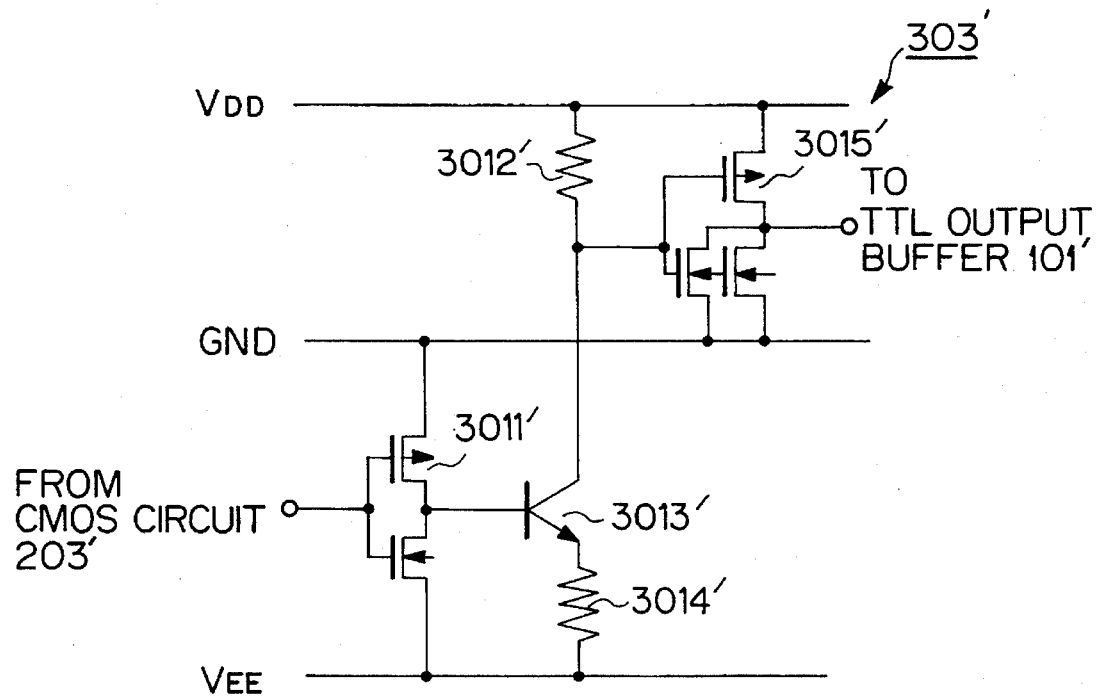
FIG. 4B is a detailed circuit diagram of the CMOS to TTL level conversion circuit of FIG. 3.

Also, as illustrated in FIG. 4B, the CMOS to TTL level conversion circuit 301' is constructed by a first level conversion stage including a CMOS inverter 3011' between the power supplies GND and $V_{EE}$, a second level conversion stage including a resistor 3012', a transistor 3013' and a resistor 3014' in series between the power supplies $V_{DD}$ and GND, and a third level conversion stage including a CMOS inverter 3015' between the power supplies $V_{DD}$ and GND.

Also, in FIG. 3, note that the elements of a system operated on the positive power supply side, i.e., by the two power supply voltages $V_{DD}$ and GND are indicated by reference numerals over 100' such as 101'; the elements of a system operated on the negative power supply side, i.e., by the two power supply voltages $V_{EE}$ and GND are indicated by reference numerals over 200' such as 201' to 203'; and the elements of a system operated by the three power supply voltages $V_{DD}$, $V_{EE}$ and GND are indicated by reference numerals over 300' such as 301'.

In the semiconductor device of FIG. 3, as stated above, since the CMOS circuit 203' is based upon the power supply voltage $V_{EE}$ (precisely, 5.2 V or 4.5 V), the establishment of reliability and duration of gate oxide layers becomes a question in a CMOS device where the gate length is less than 0.5 μm and the thickness of gate oxide films is less than 100 nm and is operated under a power supply voltage of less than 3.3 V.

Figure 5:
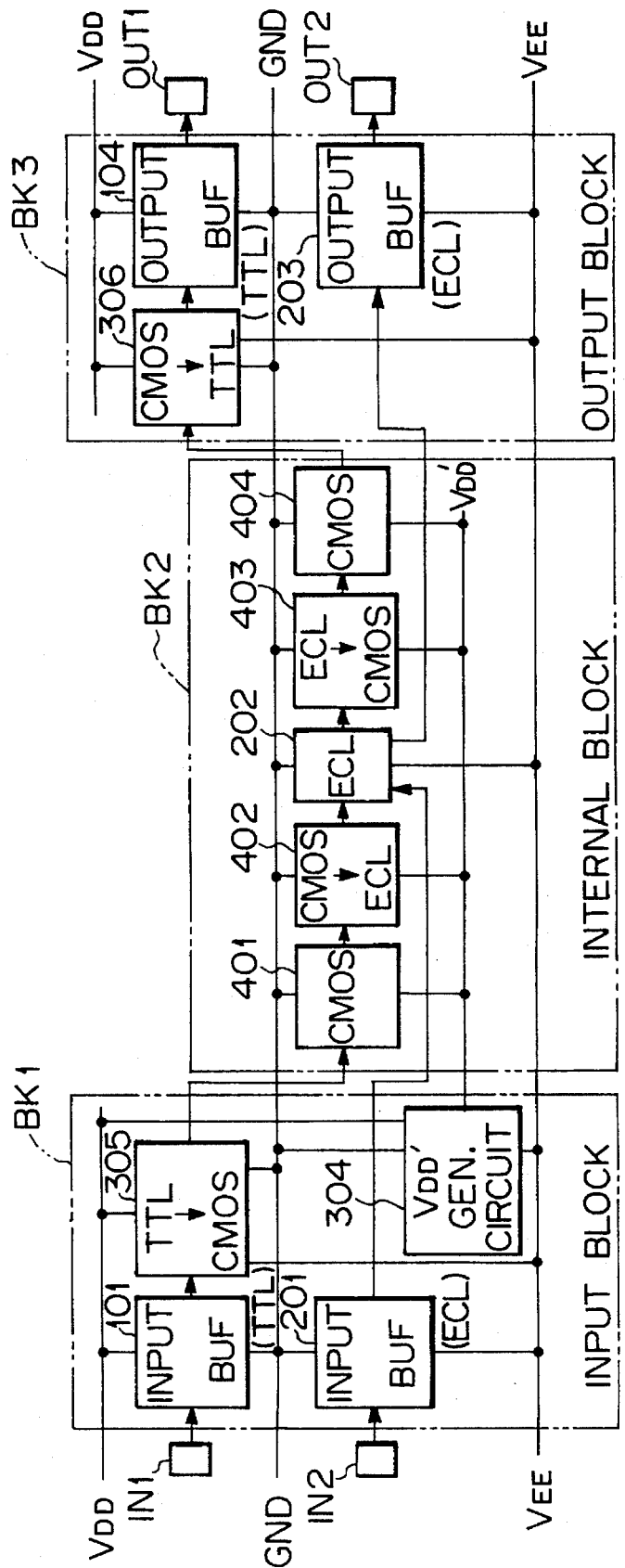
FIG. 5 is a block circuit diagram illustrating a first embodiment of the semiconductor device according to the present invention.

In FIG. 5, which illustrates a first embodiment of the present invention, CMOS circuits 401 and 402 operated on a negative power supply side, i.e., between the power supply voltage GND and a power supply voltage $V_{DD}$' are provided instead of the CMOS circuit 102 and 103 of the internal block BK2 of FIG. 1 operated on the positive power supply side, i.e., between the voltages $V_{DD}$ and GND. Simultaneously, a CMOS to ECL conversion circuit 402 and an ECL to CMOS conversion circuit 403 operated on a negative power supply side, i.e., between the voltages $V_{DD}$' and GND are provided instead of the CMOS to ECL level conversion circuit 301 and the ECL to CMOS level conversion circuit 302 of FIG. 1 operated by the voltages $V_{DD}$, $V_{EE}$ and GND. Here,

GND>$V_{DD}$'>$V_{EE}$

For example, if

|$V_{DD}$'|=$V_{DD}$,               (1)

the circuit and device configuration of the CMOS circuits 401 and 402 can be the same as those of the CMOS circuits 102 and 103 of FIG. 1.

Figure 6A:
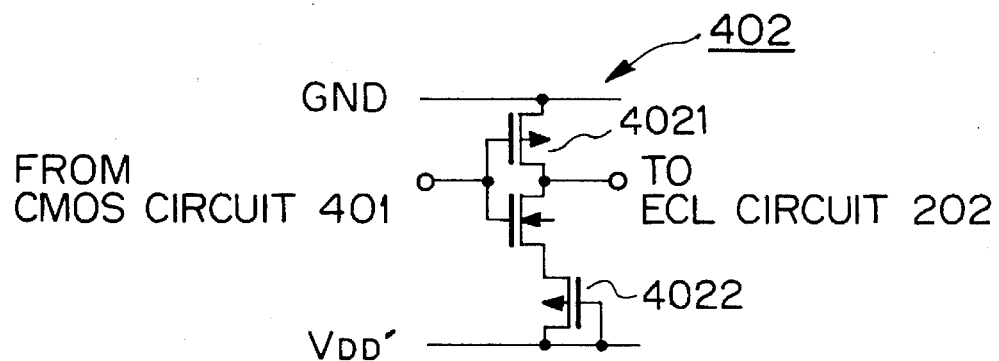
FIG. 6A is a detailed circuit diagram of the CMOS to ECL level conversion circuit of FIG. 5.

As illustrated in FIG. 6A, the CMOS to ECL level conversion circuit 402 is constructed by a CMOS inverter 4021 and a transistor 4022 as a load in series connected between the power supplies GND and $V_{DD}$'. Therefore, the number of elements and the area of a layout can be reduced and the level conversion speed can be increased as compared with the CMOS to ECL level conversion circuit 301 of FIG. 2A. Note that the CMOS to ECL level conversion circuit 402 may be unnecessary if the ECL circuit 202 is modified.

Figure 6B:
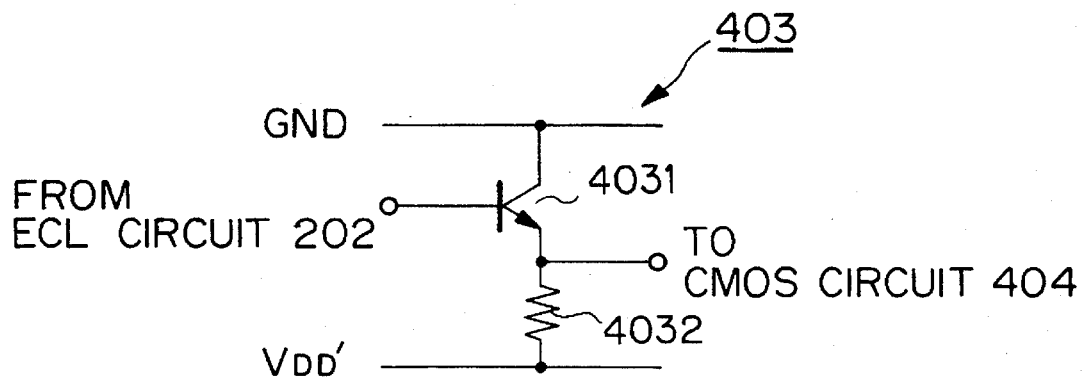
FIG. 6B is a detailed circuit diagram of the ECL to CMOS level conversion circuit of FIG. 5.

Also, as illustrated in FIG. 6B, the ECL to CMOS level conversion circuit 403 is constructed by a transistor 4031 and a resistor 4032 connected in series between the power supplies GND and $V_{DD}'$. Therefore, the number of elements and the area of a layout can be reduced and the level conversion speed can be increased as compared with the ECL to CMOS level conversion circuit 301 of FIG. 2B. For example, if $V_{DD}'$ is −3.3 V the conversion amount of a high level is 0.0 V+0.8 V=0.8 V, and the conversion amount of a low level is 3.3 V−1.4 V=1.6 V in the level conversion circuits 402 and 403. That is, the high level conversion amount is reduced by the difference 3.3 V in potential and the low level conversion amount is enlarged by the difference 0.2 V in potential as compared with the semiconductor device of FIG. 1. Therefore, the sum of the conversion amounts of a high level and a low level is smaller by 3.1 V in the semiconductor device of FIG. 5 than in the semiconductor device of FIG. 1. In other words, the power delay product of the circuit is improved by this sum in the semiconductor device of FIG. 5 as compared with the semiconductor device of FIG. 1.

Figure 7A:
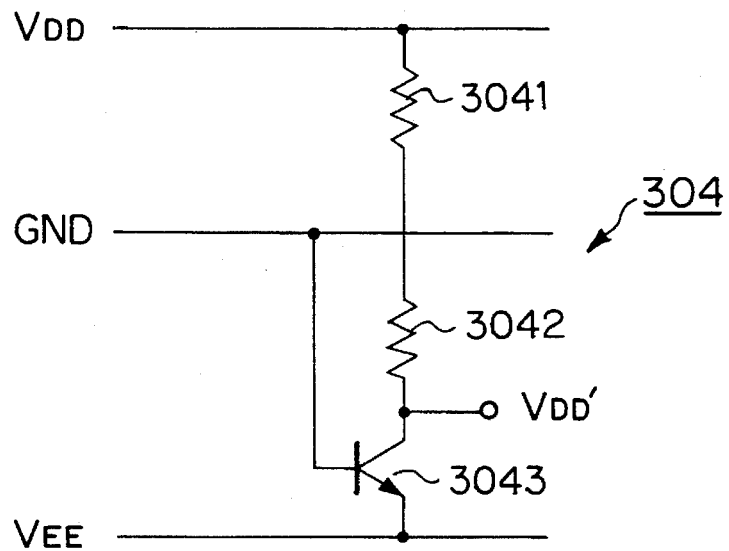
FIGS. 7A and 7B are detailed circuit diagram of the $V_{DD}'$ voltage generating circuit of FIG. 5.
Figure 7B:
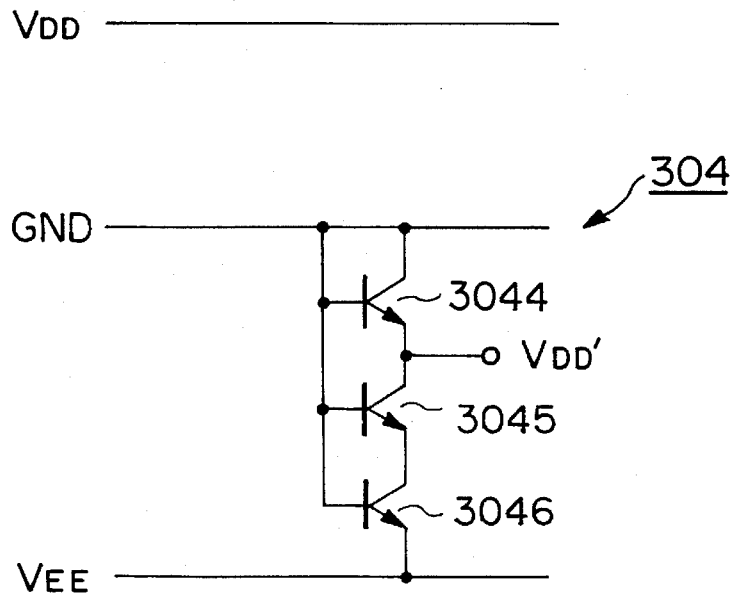

Also, a $V_{DD}'$ voltage generating circuit 304 for generating the power supply voltage $V_{DD}'$ in the internal block BK2 is provided in the input block BK1. This $V_{DD}'$ voltage generating circuit 304 is operated by the three power supply voltages $V_{DD}$, $V_{EE}$ and GND. For example, this circuit 304 is constructed by resistors 3041 and 3042, and a transistor 3043 connected in series between the power supplies $V_{DD}$ and $V_{EE}$, as illustrated in FIG. 7A. In this case, the transistor 3043 is controlled by the voltage GND. Also, the circuit 304 can be a combination of base-emitter voltages $V_{EE}$ of transistors 3044, 3046 and 3047 as illustrated in FIG. 7B.

Figure 8A:
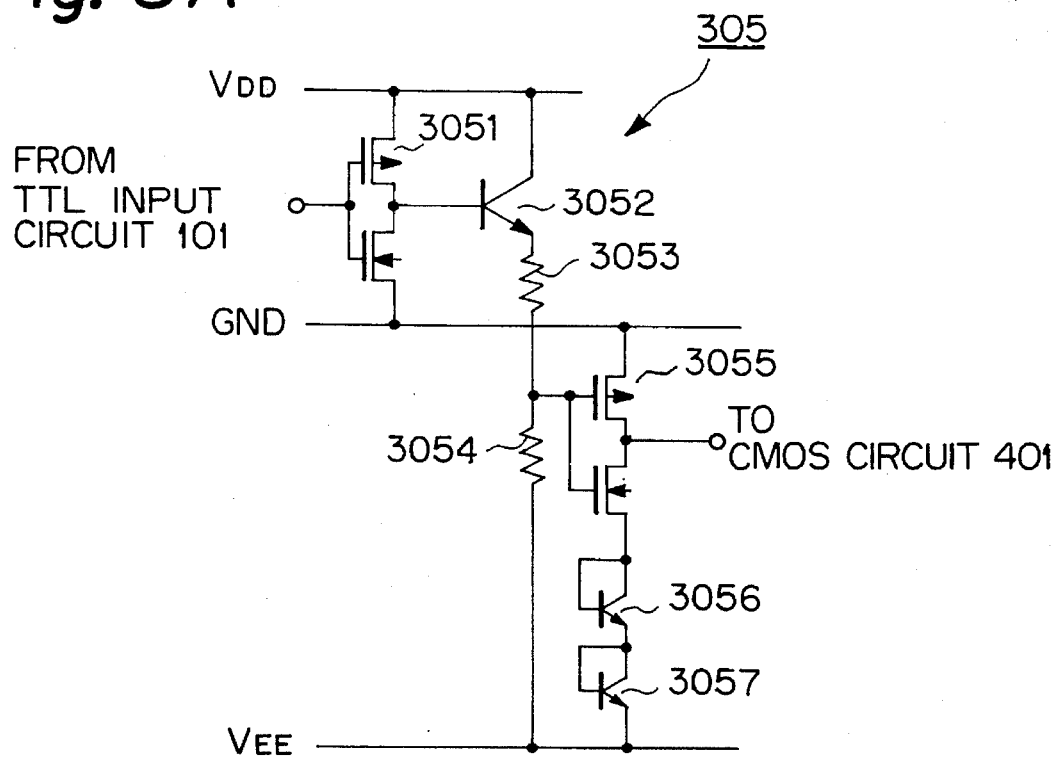
FIG. 8A is a detailed circuit diagram of the TTL to CMOS level conversion circuit of FIG. 6.

In FIG. 5, a signal input from a TTL input terminal IN1 is supplied via the TTL input buffer 101 to a TTL to CMOS level conversion circuit 305 in the input block BK1, and is converted into the negative power supply side i.e., between GND and $V_{DD}'$, so that the output of the circuit 305 is input to the CMOS circuit 401 operated on the negative power supply side. This TTL to CMOS level conversion circuit 305 is operated by the three power supply voltages $V_{DD}$, $V_{EE}$ and GND. As illustrated in FIG. 8A, the TTL to CMOS level conversion circuit 305 is constructed by a first level conversion stage including a CMOS inverter between the power supplies $V_{DD}$ and GND, a second level conversion stage including a transistor 3052 and resistors 3053 and 3054 connected in series between the power supplies $V_{DD}$ and GND, and a third level conversion stage including a CMOS inverter 3055 and diode-connected transistors 3056 and 3057. Conversely, an output from the CMOS circuit 404 operated on the negative power supply side is converted by a CMOS to TTL level conversion circuit 306 into a positive power supply side, i.e., between the power supplies GND and $V_{DD}$, and is then input to the TTL output buffer 104.

Figure 8B:
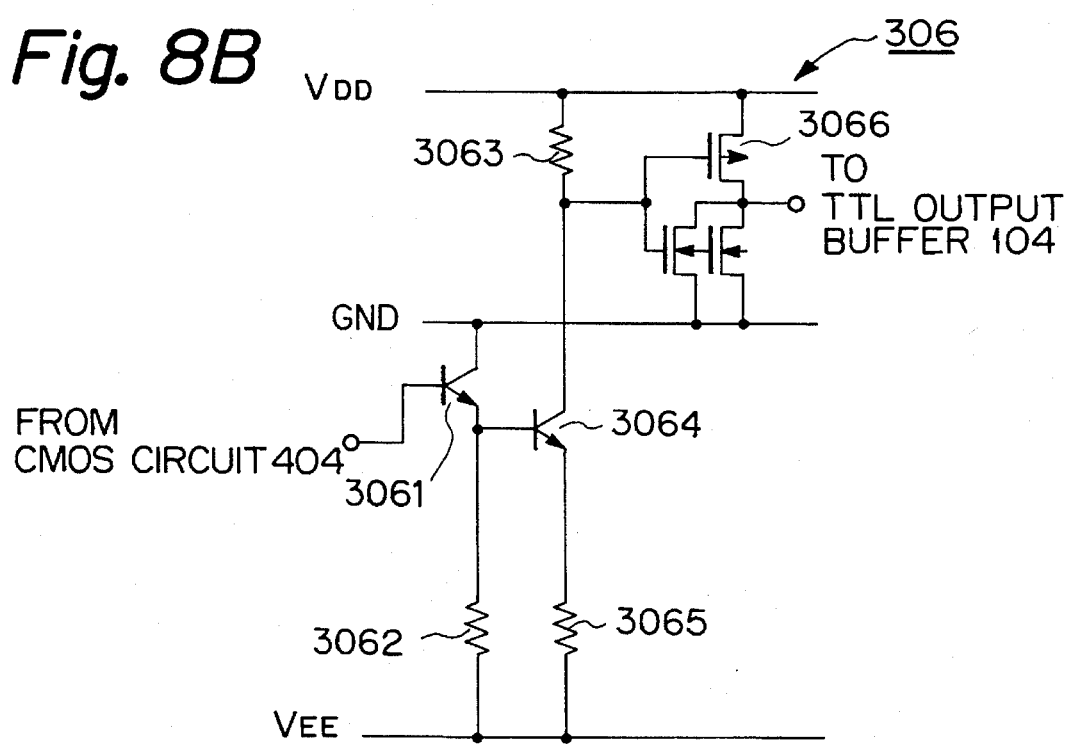
FIG. 8B is a detailed circuit diagram of the CMOS to TTL level conversion circuit of FIG. 6.

As illustrated in FIG. 8B, the CMOS to TTL level conversion circuit 306 is constructed by a first level conversion stage including a transistor 3061 and a resistor 3062 connected in series between the power supplies GND and $V_{EE}$, a second level conversion stage including a resistor 3063, a transistor 3064 and a resistor 3065 connected in series between the power supplies $V_{DD}$ and $V_{EE}$, and a third level conversion stage including a CMOS inverter 3066 between the power supplies $V_{DD}$ and GND.

Also, In FIG. 5, note that the elements of a system operated on the positive power supply side, i.e., by the two power supply voltages $V_{DD}$ and GND are indicated by reference numerals over 100 such as 101 and 104; the elements of a system operated on the negative power supply side, i.e., by the two power supply voltages $V_{EE}$ and GND are indicated by reference numerals over 200 such as 201 to 203; the elements of a system operated by the three power supply voltages $V_{DD}$, $V_{EE}$ and GND are indicated by reference numerals over 300 such as 303, 304 and 305, and the elements of another system operated on the negative power supply side, i.e., by the two power supply voltages $V_{DD}'$ and GND are indicated by reference numerals over 400 such as 401 to 404.

Figure 9:
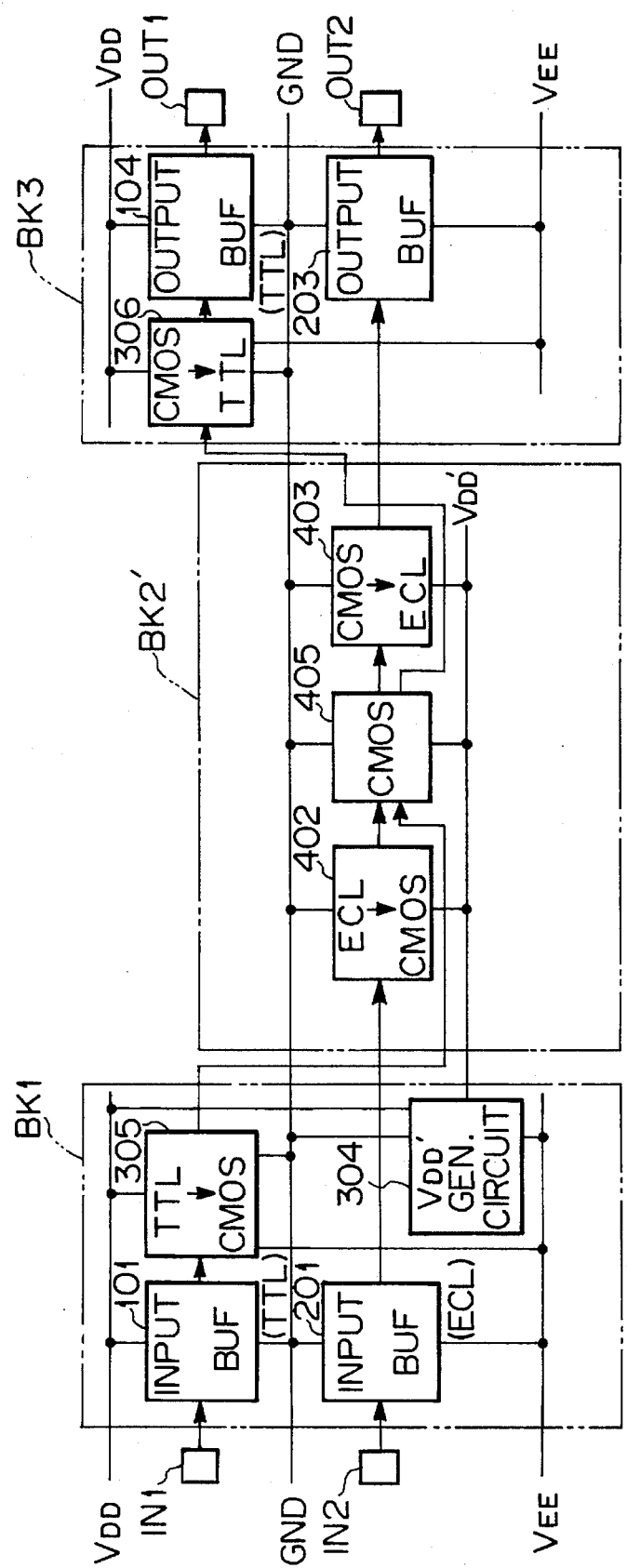
FIG. 9 is a block circuit diagram illustrating a second embodiment of the semiconductor device according to the present invention.

In FIG. 9, which illustrates a second embodiment of the present invention, the ECL circuit is absent in the internal block BK2' and a CMOS circuit 405 corresponding to the CMOS circuit 203' of FIG. 3 is present in the internal block BK2'. In this case, each element within the internal block BK2' is operated on the negative power supply side, i.e., between the power supply voltages GND and $V_{DD}'$. Therefore, tile circuit and device configuration of CMOS circuit 405 can be the same as those of the CMOS circuits 401 and 404 of FIG. 5 which can be operated on the positive power supply side, i.e., between the power supply voltages $V_{DD}$ and GND.

In the above-mentioned embodiments, note that, as compared with the ground voltage GND (=0 V), the power supply voltage $V_{DD}$ is positive, and the power supply voltages $V_{DD}'$ and $V_{EE}$ are negative. However, if the ground voltage GND is an arbitrary value, each power supply voltage is determined so as to satisfy the following relationship:

$$V_{DD} > GND > V_{DD}' > V_{EE}$$

In this case, the above-mentioned equation (1) is replaced by $$V_{DD} - GND = GND - V_{DD}'$$

As explained hereinbefore, according to the present invention, in a semiconductor device where bipolar circuits and CMOS circuits (or BiCMOS circuits) are mixed, level conversion circuits between CMOS signals and bipolar signals can be simplified and also, the level conversion speed can be increased, and further a reliability of the CMOS circuits can be established.

I claim:
1. A semiconductor device comprising:
   a first power supply voltage equal to electrical ground;
   a second power supply voltage held at a negative potential for bipolar circuits;
   a third power supply voltage and a fourth power supply voltage, said fourth power supply voltage held at a positive potential for complementary metal-oxide semiconductor (CMOS) circuits, said third power supply voltage held at a negative potential having an absolute value equal to said fourth voltage supply level;
   a bipolar circuit operated between said first power supply voltage and said second power supply voltage;
   a CMOS circuit operated between said first power supply voltage and said third power supply voltage, said third power supply voltage being between said first and second power supply voltages;
   a first level conversion circuit, connected between said bipolar circuit and said CMOS circuit, said first level conversion circuit being operated between said first and second power supply voltages; and
   a second level conversion circuit, connected to said CMOS circuit, for carrying out a level conversion between a signal having a voltage between said fourth power supply voltage and said first power supply voltage and a signal having voltage between said first power supply voltage and said second power supply voltage.

2. A device as set forth in claim 1, wherein said CMOS circuit and said bipolar circuit comprise a BiCMOS circuit.

3. A device as set forth in claim 1, further comprising a first buffer connected to said second level conversion circuit, said first buffer being operated between said fourth power supply voltage and said first power supply voltage.

4. A device as set forth in claim 1, further comprising a second buffer connected to said bipolar circuit, said second buffer being operated between said first power supply voltage and said second power supply voltage.

5. A device as set forth in claim 1, wherein a difference between said fourth power supply voltage and said first power supply voltage is approximately the same as a difference between said first power supply voltage and said third power supply voltage.

6. A semiconductor device comprising:

a first power supply voltage equal to electrical ground, a second power supply voltage held at a negative potential for bipolar circuits;

a third power supply voltage and a fourth power supply voltage, said fourth power supply voltage held at a positive potential for CMOS circuits, said third power supply voltage held at a negative potential having an absolute value equal to said fourth voltage supply level;

a first buffer operated between said first power supply voltage and said second power supply voltage;

a CMOS circuit operated between said first power supply voltage and said third power supply voltage, said third power supply voltage being between said first and second power supply voltages;

a first level conversion circuit connected between said first buffer and said CMOS circuit and being operated between said first and second power supply voltages; and a second level conversion circuit, connected to said CMOS circuit, for carrying out a level conversion between a signal having a voltage between a fourth power supply voltage and said first power supply voltage and a signal having a voltage between said first power supply voltage and said second power supply voltage.

7. A device as set forth in claim 6, wherein said CMOS circuit and said bipolar circuit comprise a BiCMOS circuit.

8. A device as set forth in claim 6, further comprising a second buffer connected to said second level conversion circuit, said second buffer being operated between said fourth power supply voltage and said first power supply voltage.

9. A device as set forth in claim 6, wherein a difference between said fourth power supply voltage and said first power supply voltage is approximately the same as a difference between said first power supply voltage and said third power supply voltage.

10. A semiconductor device comprising:

a first power supply voltage equal to electrical ground, a second power supply voltage held at a negative potential for bipolar circuits;

a third power supply voltage and a fourth power supply voltage, said fourth power supply voltage held at a positive potential for CMOS circuits, said third power supply voltage held at a negative potential having an absolute value equal to said fourth voltage supply level;

a first input buffer, connected to said first and second power supply lines, for receiving a first input signal and outputting a first internal signal having an TTL logic level;

a first level conversion circuit, connected to said first and second power supply lines, for converting said first internal signal into a second internal signal having a CMOS logic level;

a CMOS logic circuit, connected to said first and third power supply lines, for receiving said second internal signal and outputting a third internal signal having said CMOS logic level;

a second level conversion circuit, connected to said first and third power supply lines, for converting said third internal signal into a fourth internal signal having said ECL logic level; and a first output buffer, connected to said first and fourth power supply lines, for receiving said fourth internal signal and outputting a first output signal.

11. A device as set forth in claim 10, wherein said CMOS circuit and said bipolar circuit comprise a BiCMOS circuit.

12. A device as set forth in claim 10, wherein a difference between the fourth power supply voltage and the first power supply voltage is approximately the same as a difference between the first power supply voltage and the third power supply voltage.

13. A device as set forth in claim 10, wherein the first power supply voltage is a ground voltage, the second and third power supply voltages being negative voltages.

\* \* \* \* \*